United States Patent [19]

Parkhe

[11] Patent Number: 5,748,435
[45] Date of Patent: May 5, 1998

[54] APPARATUS FOR CONTROLLING BACKSIDE GAS PRESSURE BENEATH A SEMICONDUCTOR WAFER

[75] Inventor: Vijay Parkhe, Sunnyvale, Calif.

[73] Assignee: Applied Materials, Inc., Santa Clara, Calif.

[21] Appl. No.: 774,664

[22] Filed: Dec. 30, 1996

[51] Int. Cl.⁶ .................................................. H02N 13/00
[52] U.S. Cl. ............................................................ 361/234
[58] Field of Search ................................. 361/234; 269/8; 279/128

[56] References Cited

U.S. PATENT DOCUMENTS

| | | | |
|---|---|---|---|
| 4,565,601 | 1/1986 | Kakehi et al. | 156/643 |
| 4,771,730 | 9/1988 | Tezuka | 118/723 |
| 4,980,022 | 12/1990 | Fujimura | 156/643 |
| 5,103,367 | 4/1992 | Horwitz | 361/234 |
| 5,238,499 | 8/1993 | van de Ven et al. | 118/724 |
| 5,267,607 | 12/1993 | Wada | 165/80.1 |
| 5,382,311 | 1/1995 | Ishikawa | 156/345 |
| 5,427,670 | 6/1995 | Baggerman et al. | 204/298.09 |
| 5,458,687 | 10/1995 | Shchida et al. | 118/724 |
| 5,474,614 | 12/1995 | Robbins | 361/234 |
| 5,622,593 | 4/1997 | Arasawa et al. | 156/626.1 |

*Primary Examiner*—Fritz Fleming
*Attorney, Agent, or Firm*—Thomason & Moser

[57] ABSTRACT

Apparatus for providing self-regulated gas flow between a wafer and a wafer support surface of a wafer support in a semiconductor wafer processing system. The apparatus consists of a gas inlet port extending through the wafer support for supplying gas to the wafer support surface and a plurality of exhaust ports, extending from the support surface through the wafer support, for exhausting the gas from the support surface, where the plurality of exhaust ports maintain a uniform backside gas pressure between the wafer and the wafer support surface.

14 Claims, 2 Drawing Sheets

5,748,435

1

APPARATUS FOR CONTROLLING BACKSIDE GAS PRESSURE BENEATH A SEMICONDUCTOR WAFER

BACKGROUND OF THE INVENTION

1. Field of the Invention

The invention relates generally to electrostatic clamping chucks for retaining a workpiece within a semiconductor wafer processing system and, more specifically, to an improved bipolar electrostatic chuck having "self controlled" backside gas pressure to eliminate wafer pop off during processing.

2. Description of the Background Art

Electrostatic chucks are used for retaining a workpiece in various applications ranging from holding a sheet of paper in a computer graphics plotter to holding a semiconductor wafer within a semiconductor wafer process chamber. In semiconductor wafer processing equipment, electrostatic chucks are used for clamping semiconductor wafers to a pedestal during processing. Since the pedestal is in intimate contact with the wafer, it serves both as a heat sink and wafer support. In some applications, the pedestal is heated to form a heat source. These chucks find use in different types of wafer processing including etching, chemical vapor deposition (CVD), and physical vapor deposition (PVD) applications.

Electrostatic chucks secure a wafer to the chuck by creating an electrostatic attractive force between the workpiece and the chuck. A voltage is applied to one or more electrodes in the chuck to induce opposite polarity charges in the workpiece and electrodes, respectively. The opposite charges pull the workpiece against the chuck, thereby retaining the workpiece. Specifically, in a "bipolar" electrostatic chuck, two electrodes are placed side-by-side (co-planar) to create the desired electric field. A positive voltage is applied to one electrode and a negative voltage is applied to another electrode relative to some internal chamber ground reference. The opposite polarity voltages establish an electrostatic force between the wafer being clamped and the electrostatic chuck.

The materials and processes used to process a wafer are temperature sensitive. Should these materials be exposed to excessive temperature fluctuations due to poor heat transfer from the wafer during processing, performance of the wafer processing system may be compromised.

As mentioned above, the pedestal may also form a heat sink or heat source. To optimally transfer heat between the wafer and a chuck (or the chuck and the wafer), an electrostatic force is used to cause the greatest amount of wafer surface to physically contact a support surface of the chuck. However, due to surface roughness of both the wafer and the chuck, small interstitial spaces remain between the chuck and wafer that interfere with optimal heat transfer.

To promote uniform heat transfer characteristics, a heat transfer gas (such as Argon) is used beneath the wafer to fill the interstitial spaces between the wafer and the chuck surface. This gas acts as a thermal conduction medium from the wafer to the chuck that has better heat transfer characteristics than the vacuum it replaces thereby promoting uniform heat conduction across the entire bottom surface of the wafer.

However, when a bipolar electrostatic chuck is used to electrostatically clamp a wafer to a pedestal, non-uniform bias voltage on the wafer creates an uneven clamping force across the chuck surface. In other words, because the wafer bias voltage is non-uniform causing imbalanced charge accumulation, one electrode in the chuck produces a greater attractive force and thus pulls down harder on the wafer than the other electrode. This imbalance in the chucking force causes increased leakage of the heat transfer gas from beneath a portion of the wafer that is retained by the lesser clamping force, which in turn causes uneven gas pressure beneath the wafer. If the pressure imbalance is great enough, the wafer will pop off the chuck and become improperly aligned or seated on the pedestal. In the worst case, the wafer may completely pop off the pedestal and lie in a location within the chamber that is irretrievable by a wafer transport robot. Once a wafer pops off the chuck, the wafer will be improperly processed and can no longer be used to create the intended final product. Furthermore, as a result of the wafer being misaligned or completely dislodged from the pedestal, particles from the target deposit on the surface of the electrostatic chuck. Once a chuck is contaminated in this manner, it can no longer be used and a new chuck must be installed on the pedestal.

Furthermore, the quick release of gas during the pop off can mobilize otherwise static particles and introduce debris or contaminants to the wafer surface which cause defects in the final product. Additionally, some wafers are processed in a series of chambers before the final product is completed. Typically, a wafer is transferred from one chamber to the next via a robotic arm of a wafer transfer robot. Once a wafer has shifted position on the pedestal due to pop off, the centering mechanism of the robotic arm will become misaligned as it attempts to pick up the wafer. Consequently, the misaligned wafer will be improperly positioned in subsequent chambers and potential for contaminating the electrostatic chucks in subsequent chambers increases.

Therefore, there is a need in the art for an improved apparatus in a semiconductor wafer processing chamber that uniformly clamps a wafer to the support surface, self regulates the backside gas pressure, and distributes heat transfer gas evenly to eliminate wafer pop off without adding considerably to manufacturing costs.

SUMMARY OF THE INVENTION

The disadvantages heretofore associated with the prior art are overcome by an apparatus for self-controlling (or self-regulating) a backside gas flow beneath a wafer supported by an electrostatic chuck in a semiconductor wafer processing system. The inventive apparatus provides a pedestal with a top surface and a sidewall and an electrostatic chuck adhered to the top surface of the pedestal. The electrostatic chuck is a bipolar chuck having a pair of electrodes imbedded in a dielectric material. In lieu of adhering a separate chuck to the pedestal, the chuck can be an integral part of the pedestal, i.e., the electrodes can be imbedded beneath the pedestal surface.

The electrostatic chuck has grooves in a wafer support surface to provide uniform distribution of a heat transfer gas. The gas is provided to the grooves by at least one inlet port that extends through the pedestal and chuck. The gas inlet port is located proximate the center of the chuck. Additionally, the pedestal has backside gas exhaust port(s) extending from the gas distribution grooves through the chuck and the pedestal. These exhaust ports channel the backside gas from the chuck surface, through the pedestal, and to the sidewall of the pedestal. The gas is exhausted radially outward of the pedestal sidewall into the chamber. The dimensions of the exhaust port(s) provide a nominal heat transfer gas pressure beneath the wafer thereby maintaining sufficient heat transfer from the wafer to the chuck (or vice versa). In one exemplary embodiment, there are eight exhaust ports each having a diameter of approximately 1.6 mm which results in a nominal backside gas pressure of 6–9 Torr.

The invention provides a constant flow of backside gas from one or more inlet ports to the plurality of exhaust ports. When an imbalanced clamping force is applied to the wafer, the gas pressure increases beneath the portion of the wafer that is experiencing the relative increase in clamping force. As the pressure increases, the flow rate through the exhaust ports automatically increases to relieve the increased pressure. As such, the gas pressure beneath the wafer remains substantially uniform and the probability of wafer pop off is substantially reduced. Thus, the invention provides apparatus that self regulates the backside gas pressure beneath a wafer to avoid wafer pop off.

BRIEF DESCRIPTION OF THE FIGURES

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

Figure 1:
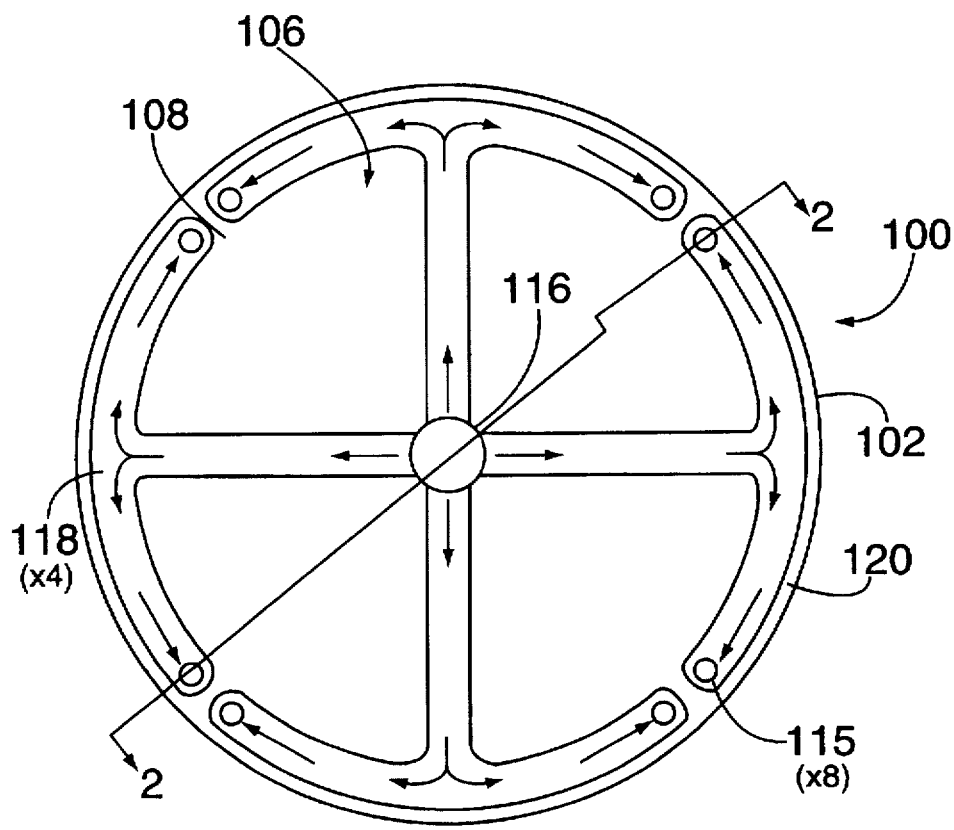
FIG. 1 is a top view of the inventive apparatus.
Figure 2:
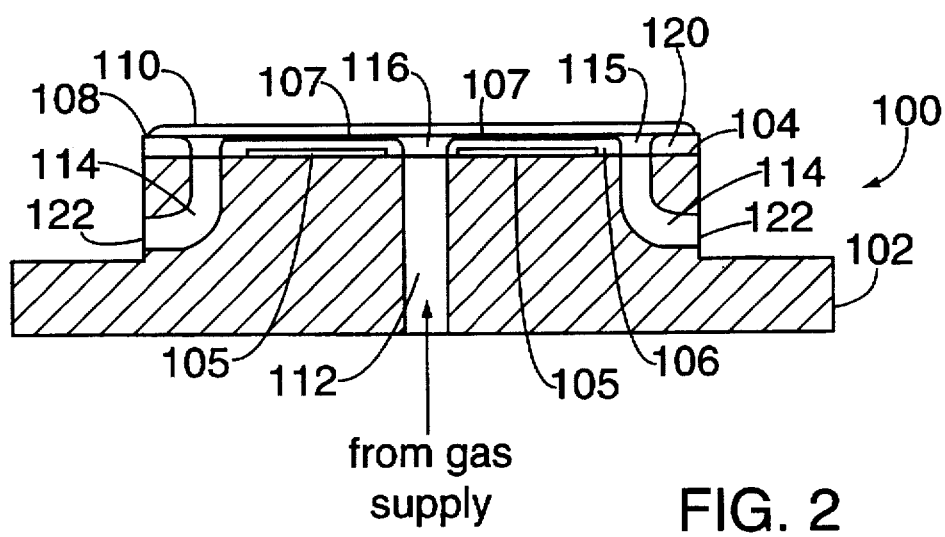
FIG. 2 is a cross-sectional view of apparatus as seen long lines 2—2 of FIG. 1.
Figure 3:
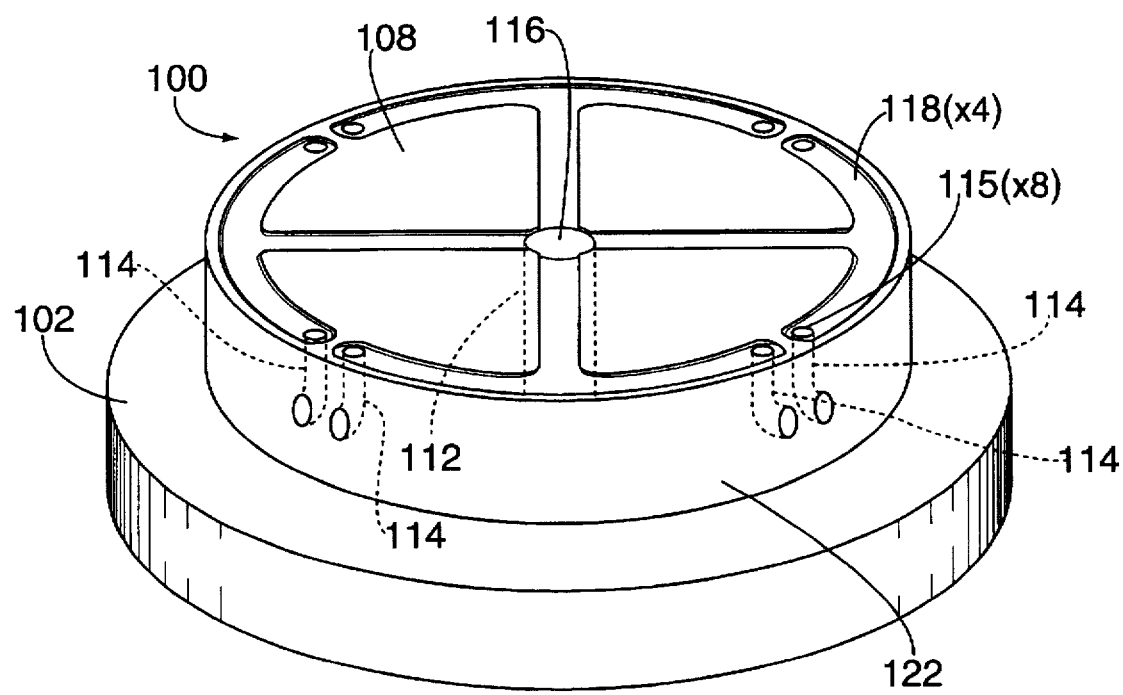
FIG. 3 is a perspective view of the apparatus of FIG. 1.

FIG. 1 depicts a top view of the inventive apparatus 100 containing an electrostatic chuck 106 adapted to support and electrostatically retain a workpiece to be processed, such as a semiconductor wafer, on a pedestal 102 within a semiconductor wafer processing system (not shown). FIG. 2 depicts a cross-sectional view of the apparatus 100 of FIG. 1 taken along line 2—2 with a semiconductor wafer 110 shown clamped onto a surface 108 of the electrostatic chuck 106 adhered to the pedestal 102. FIG. 3 is a perspective view of the apparatus with the wafer removed. To best understand the invention, the reader should simultaneously refer to FIGS. 1, 2 and 3.

More specifically, the apparatus of the present invention contains a pedestal 102 and an electrostatic chuck 106. Preferably the pedestal is a durable metal having a top surface 104. To create the necessary attractive force to clamp a wafer, a bipolar electrostatic chuck 106 is adhered to the top surface 104 of the pedestal 102. Electrostatic chucks and their operation are generally well known in the art. Although any form of bipolar chuck is applicable, FIGS. 1, 2 and 3 depict a pair of coplanar electrodes 105 imbedded within a dielectric material. In particular, the electrodes are half-moon shaped and are sandwiched between a pair of polyimide layers. Alternatively, the electrodes could be imbedded within a ceramic material. Chucking voltages are applied to the electrodes 105. Specifically, a positive voltage is applied to one electrode and a negative voltage is applied to the other electrode.

The electrostatic chuck 106 has a workpiece support surface 108 for supporting a workpiece such as a semiconductor wafer 110. With the chucking voltages applied, the wafer is drawn toward the surface 108 of the chuck 106 and electrostatically clamped thereto.

Although a separate bipolar chuck is shown and described as being adhered to the pedestal, the chuck can be an integral portion of the pedestal. For example, the pedestal can be fabricated of ceramic and the electrodes imbedded beneath the surface of the pedestal. Such chuck/pedestal combinations are common in the art.

The pedestal is provided with at least one inlet port 112 for introducing a heat transfer gas (preferably an inert gas such as Argon or Helium) to the interstitial spaces 107 between the backside of the wafer and the chuck surface 108. The inlet port 112 extends from the top surface 104 of the pedestal 102, through the pedestal 102 into a process chamber (not shown). The port 112 is connected to the necessary plumbing to carry the gas from an external gas supply to the chamber. Preferably, this inlet port 112 is located at the center of the pedestal 102. An opening 116 is provided in the electrostatic chuck 106 to allow the gas to flow from the pedestal 102 to the backside of the wafer 110. To ensure uniform distribution of the gas across the backside of the wafer 110, the electrostatic chuck surface 108 is provided with gas distribution grooves 118. Illustratively, these grooves 118 extend radially outward from the inlet port 112 to near the periphery 120 of the electrostatic chuck 106. Once reaching the periphery 120, the grooves branch to form a "T" shape extending a total of one fourth of the circumference of the electrostatic chuck 106. Four such "T" shaped grooves provide adequate coverage for the gas to reach nearly the entire backside of the wafer 110. The "T" shaped grooves are considered illustrative of a pattern that is used in combination with the invention. Those skilled in the art will realize that any pattern and arrangement of gas distribution grooves (as well as the use of no grooves at all) is within the scope of this invention.

The pedestal 102 is also provided with exhaust ports 114 which allow the gas to escape (or flow) at a controlled rate from the backside of the wafer. Specifically, a plurality of openings 115 (e.g., eight) in the electrostatic chuck 106 are provided near the end of each peripheral branch in the "T" shaped grooves. One exhaust port 114 is located below and aligned with each of the openings 115. As depicted by the arrows in FIG. 1, the gas flows from the inlet port 112, across the chuck surface 108 to the exhaust ports 114. The exhaust ports 114 extend into the pedestal, turn at a right angle and extend radially outward to the sidewall 122 of the pedestal 102. Alternatively, the ports 114 can be diagonally drilled to connect each opening 115 to the pedestal sidewall 122. Furthermore, the ports could be bored vertically through the chuck and pedestal to exhaust the gas below the pedestal. Such exhaust ports could further be coupled to plumbing to exhaust the gas from the reaction chamber and/or recycle the gas for further use.

Excess gas pressure caused by uneven backside gas pressure is carried away from the backside of the wafer and vented into the process chamber. As such, if the bipolar chuck non-uniformly clamps the wafer, pop off of the wafer is avoided by venting the gas into the process chamber to self regulate the backside gas pressure. Since the heat transfer gas is inert or the same as the process gas, there is no possibility of contamination of the processing environment caused by the venting of the excess heat transfer gas.

The purpose of the exhaust ports is to attain a self-controlled leakage of the backside gas. To facilitate adequate cooling (or heating) of the wafer, it is important that the exhaust ports be of a particular size to maintain a certain minimum heat transfer gas pressure beneath the wafer. If the ports are too large, the leakage rate is excessive. As such, temperature regulation and heat transfer using gases such as Argon and Helium are not effective. If the ports are too small, a gas pressure imbalance does not vent (leak through) at a high enough rate and wafer pop off can still occur. Ideally, the diameter of each of the eight exhaust ports is approximately 1/16" (1.6 mm) to provide a nominal backside gas pressure of 6–9 Torr.

Figure 4:
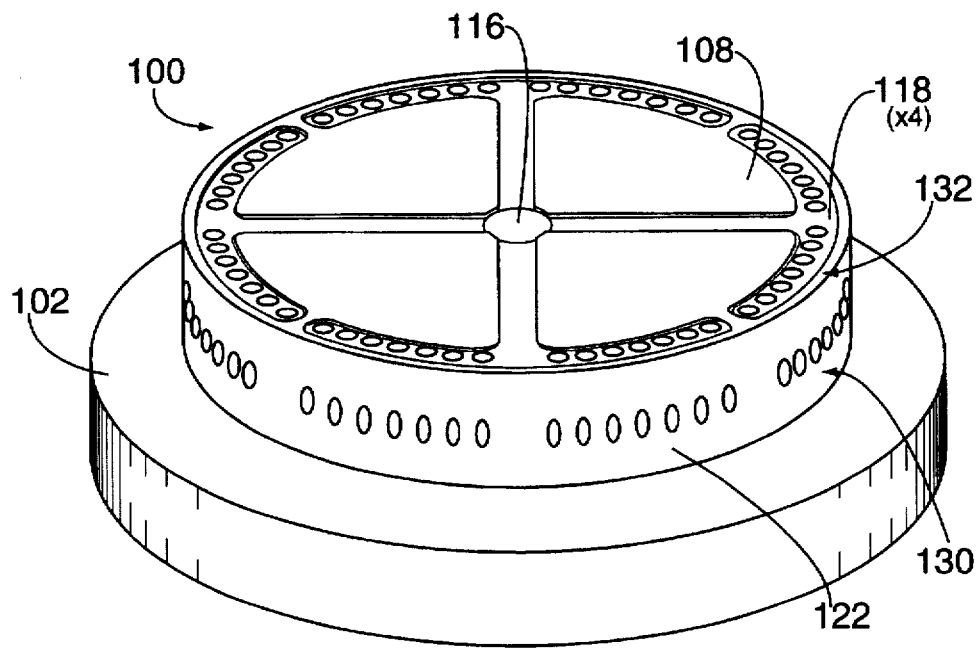
FIG. 4 is a perspective view of a second embodiment of the inventive apparatus.

FIG. 4 depicts a perspective view of an alternate embodiment for the inventive apparatus. In this embodiment the placement and number of exhaust ports has changed with all other details being the same as the first embodiment. Specifically, the eight ports located at the end of each "T" shaped branch (of FIG. 3) are replaced with a series of smaller ports 130 also venting excess gas through the pedestal sidewall. As in the first embodiment, a corresponding number of openings 132 are provided in the electrostatic chuck surface 108 to allow for gas flow into the ports 130. In this embodiment, reaction to uneven gas pressure is enhanced in that there are more locations available to vent excess gas.

Although various embodiments which incorporate the teachings of the present invention have been shown and described in detail herein, those skilled in the art can readily devise many other varied embodiments that still incorporate these teachings.

What is claimed is:

1. Apparatus for controlling backside gas pressure for a gas flowing between a wafer and a wafer support surface of a wafer support in a semiconductor wafer processing chamber comprising:
   a gas inlet port extending through the wafer support for supplying gas to the wafer support surface; and
   a plurality of exhaust ports, extending from the support surface through the wafer support, for exhausting the gas from the support surface into the chamber where the plurality of exhaust ports maintain a uniform backside gas pressure between the wafer and the wafer support surface.

2. The apparatus of claim 1 wherein the plurality of exhaust ports extend from the support surface to a sidewall of the wafer support and are uniformly distributed proximate the periphery of the wafer support surface.

3. The apparatus of claim 1 wherein said wafer support further comprises a pedestal and an electrostatic chuck, where the electrostatic chuck contains said wafer support surface.

4. The apparatus of claim 3 wherein the electrostatic chuck is bipolar.

5. The apparatus of claim 1 wherein the support surface of the wafer support comprises a plurality of gas distribution grooves.

6. The apparatus of claim 5 wherein the grooves are "T" shaped.

7. The apparatus of claim 6 wherein branches of each "T" shaped groove extend approximately one fourth of a circumference of the wafer support.

8. The apparatus of claim 4 wherein the plurality of grooves is four.

9. The apparatus of claim 5 wherein there are fours grooves that are "T" shaped and branches of each "T" shaped groove extend approximately one fourth of a circumference of the wafer support, where an end of each branch contains an exhaust port.

10. The apparatus of claim 1 wherein the diameter of each of the plurality of exhaust ports is about 1.6 mm.

11. The apparatus of claim 1 wherein the number of exhaust ports is eight.

12. Apparatus for providing self-regulated gas flow between a wafer and a wafer support surface of a wafer support in a semiconductor wafer processing system comprising:
   a pedestal with a top surface and a sidewall;
   an electrostatic chuck adhered to the top surface of the pedestal, the electrostatic chuck having grooves in a wafer support surface;
   a gas inlet port extending through the pedestal and electrostatic chuck for supplying gas to the grooves; and
   a plurality of exhaust ports connecting a groove to the sidewall by extending through the pedestal for directing the flow of gas away from the wafer support surface.

13. The apparatus of claim 12 wherein the plurality of exhaust ports are uniformly distributed proximate the periphery of the wafer support surface.

14. The apparatus of claim 12 wherein there are fours grooves that are "T" shaped and branches of each "T" shaped groove extend approximately one fourth of a circumference of the wafer support, where an end of each branch contains an exhaust port.

* * * * *